(12) United States Patent
Sun et al.

(10) Patent No.: US 7,012,025 B2
(45) Date of Patent: Mar. 14, 2006

(54) TANTALUM REMOVAL DURING CHEMICAL MECHANICAL POLISHING

(75) Inventors: Lizhong Sun, San Jose, CA (US); Stan D. Tsai, Fremont, CA (US); Shijian Li, San Jose, CA (US); Feng Liu, Cupertino, CA (US)

(73) Assignee: Applied Materials Inc., Santa Clara, CA (US)

( * ) Notice: Subject to any disclaimer, the term of this patent is extended or adjusted under 35 U.S.C. 154(b) by 721 days.

(21) Appl. No.: 09/755,717

(22) Filed: Jan. 5, 2001

(65) Prior Publication Data

US 2002/0090820 A1    Jul. 11, 2002

(51) Int. Cl.
*H01L 21/302* (2006.01)
(52) U.S. Cl. .................. 438/691; 438/692; 438/693; 252/79.1
(58) Field of Classification Search ........ 438/690–693; 252/79.1, 79.2
See application file for complete search history.

(56) References Cited

U.S. PATENT DOCUMENTS

| | | | |
|---|---|---|---|
| 4,920,031 A | 4/1990 | Ohno et al. ................. 430/522 |
| 5,014,468 A | 5/1991 | Ravipati et al. .............. 51/295 |
| 5,340,370 A | 8/1994 | Cadien et al. ................ 51/308 |
| 5,453,312 A | 9/1995 | Haas et al. .................. 428/143 |
| 5,454,844 A | 10/1995 | Hibbard et al. ............... 51/295 |
| 5,676,587 A | 10/1997 | Landers et al. ............... 451/57 |
| 5,692,950 A | 12/1997 | Rutherford et al. .......... 451/552 |
| 5,693,563 A | 12/1997 | Teong ......................... 437/190 |
| 5,735,963 A | 4/1998 | Obeng ............................. 134/3 |
| 5,770,095 A | 6/1998 | Sasaki et al. ................. 216/38 |
| 5,783,489 A | 7/1998 | Kaufman et al. ............ 438/962 |
| 5,820,450 A | 10/1998 | Calhoun ...................... 451/530 |
| 5,842,910 A | 12/1998 | Krywanczyk et al. ........ 451/41 |
| 5,893,796 A | 4/1999 | Birang et al. ................ 451/526 |
| 5,954,997 A | 9/1999 | Kaufman et al. ........... 252/79.1 |

(Continued)

FOREIGN PATENT DOCUMENTS

EP    1 006 166 A1    6/2000

(Continued)

OTHER PUBLICATIONS

International Search Report for PCT/US02/00062, Jul. 8, 2002.

(Continued)

*Primary Examiner*—Lan Vinh
(74) *Attorney, Agent, or Firm*—Patterson & Sheridan (57) ABSTRACT

The invention relates generally to a composition and a method for selective removal of a barrier layer in chemical mechanical polishing. In one aspect, the composition for selective removal of a barrier layer includes at least one reducing agent, ions from at least one transitional metal, and water. The composition may further include at least one buffer for pH stability, at least one pH adjusting agent for providing an initial pH, a corrosion inhibitor, abrasive particles, and/or a metal chelating agent. In another embodiment, the invention relates generally to a composition and a method for removal of a conductive material layer and a barrier layer in chemical mechanical polishing. In one aspect, the method for removal of a conductive material layer and a barrier layer includes applying a conductive-material-layer-selective composition to a polishing pad, polishing the substrate in presence of the conductive-material-layer-selective composition, applying a barrier-layer-selective composition to a polishing pad, and polishing the substrate in presence of the barrier-layer-selective composition.

3 Claims, 3 Drawing Sheets

U.S. PATENT DOCUMENTS

| | | | |
|---|---|---|---|
| 5,981,454 A | 11/1999 | Small | 510/175 |
| 5,985,748 A | 11/1999 | Watts et al. | 438/622 |
| 6,001,730 A | 12/1999 | Farkas et al. | 438/627 |
| 6,074,949 A | 6/2000 | Schonauer et al. | 438/692 |
| 6,083,840 A | 7/2000 | Mravic et al. | 438/693 |
| 6,117,775 A * | 9/2000 | Kondo et al. | 438/690 |
| 6,117,783 A * | 9/2000 | Small et al. | 438/693 |
| 6,136,714 A | 10/2000 | Schutz | 438/692 |
| 6,143,656 A | 11/2000 | Yang et al. | 438/687 |
| 6,156,661 A | 12/2000 | Small | 438/692 |
| 6,183,686 B1 | 2/2001 | Bardus et al. | 419/8 |
| 6,194,317 B1 * | 2/2001 | Kaisaki et al. | 438/692 |
| 6,218,290 B1 | 4/2001 | Schonauer et al. | 438/633 |
| 6,258,721 B1 | 7/2001 | Li et al. | 438/693 |
| 6,271,416 B1 | 8/2001 | Takagaki et al. | 562/433 |
| 6,313,039 B1 * | 11/2001 | Small et al. | 438/693 |
| 6,375,559 B1 | 4/2002 | James et al. | 451/527 |
| 6,436,830 B1 * | 8/2002 | Merchant et al. | 438/692 |
| 2002/0090820 A1 | 7/2002 | Sun et al. | 438/690 |

FOREIGN PATENT DOCUMENTS

| | | |
|---|---|---|
| EP | 1 011 131 | 6/2000 |
| EP | 1 085 067 | 3/2001 |
| EP | 1 104 020 A1 | 5/2001 |
| EP | 1 125 999 A1 | 8/2001 |
| FR | 1 603 558 | 6/2001 |
| JP | 2001-127018 | 5/2001 |
| JP | 2001-139937 | 5/2001 |
| WO | WO 98/04646 | 2/1998 |
| WO | WO 98/36045 | 8/1998 |
| WO | 98/41671 | 9/1998 |
| WO | 98/49723 | 11/1998 |
| WO | 00/02238 | 1/2000 |
| WO | WO 00/00561 | 1/2000 |
| WO | 00/30159 | 5/2000 |
| WO | WO 00/24842 | 5/2000 |

OTHER PUBLICATIONS

U.S. Appl. No. 09/569,968, filed May 11, 2000, (Sun, et al.).
U.S. Appl. No. 09/968,863, filed Oct. 27, 2000, (Tsai, et al.).
U.S. Appl. No. 09/968,864, filed Oct. 27, 2000, (Sun, et al.).
U.S. Appl. No. 10/187,857, filed Jun. 27, 2002, (Tsai, et al.).
U.S. Appl. No. 10/193,810, filed Jul. 11, 2002, (Tsai, et al.).
U.S. Appl. No. 10/215,521, filed Aug. 8, 2002, (Sun, et al.).
PCT International Search Report from International Application No. PCT/US01/50150, Dated Sep. 23, 2002.
Partial Search Report (Form PCT/ISA/206—Annex) for PCT/US02/22126, dated Dec. 6, 2002.
Written Opinion from PCT International Preliminary Examining Authority for US/02/00062, dated May 12, 2003.
"Aluminum Based Multilevel Metallizations", from Handbook of Multilevel Metallization for Integrated Circuits, Wilson & Tracy, Eds. (1993), pp. 139-140.
U.S. Appl. No. 09/401,643, filed Sep. 22, 1999.
U.S. Appl. No. 09/569,968, filed May 11, 2000.
U.S. Appl. No. 09/741,538, filed Dec. 19, 2000.
U.S. Appl. No. 09/469,709, filed Nov. 29, 2000.
US 5,985,755, 11/1999, Bajaj et al. (withdrawn)

* cited by examiner

TANTALUM REMOVAL DURING CHEMICAL MECHANICAL POLISHING

BACKGROUND OF THE INVENTION

1. Field of the Invention

The present invention relates generally to chemical mechanical polishing and planarization of semiconductor devices. More specifically, the invention relates to a method and composition for removing a barrier layer in chemical mechanical polishing.

2. Background of the Related Art

In order to further improve the current density of semiconductor devices on integrated circuits, it has become necessary to use conductive materials having low resistivity for conductors and to use materials having a low dielectric constant (low k, defined herein as having dielectric constants, k, less than about 4.0) as insulating layers to reduce the capacitive coupling between adjacent interconnects. Increased capacitative coupling between layers can detrimentally affect the functioning of semiconductor devices.

One conductive material gaining acceptance is copper and its alloys, which have become the materials of choice for sub-quarter-micron interconnect technology because copper has a lower resistivity than aluminum (1.7 $\mu\Omega$-cm compared to 3.1 $\mu\Omega$-cm for aluminum), a higher current carrying capacity, and significantly higher electromigration resistance. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch. Achieving precise pattern etching with copper using traditional deposition/etch processes for forming interconnects has been less than satisfactory. Therefore, new methods of manufacturing semiconductors with copper interconnects are being developed.

One method for forming vertical and horizontal interconnects is by a damascene or dual damascene method. In the damascene method, one or more dielectric materials, such as the low k dielectric materials, are deposited and pattern etched to form the vertical and horizontal interconnects. Conductive materials (such as copper) and other materials (such as barrier layer materials used to prevent diffusion of conductive material into the surrounding low k dielectric) are then inlaid into the etched pattern. Barrier layer materials include, for example, tantalum (Ta), tantalum nitride (TaN), titanium (Ti), and titanium nitride (TiN). Conductive material and barrier layer material external to the interconnects, such as on the field of the substrate is removed.

One method of removing the excess deposited conductive material and barrier layer material is through planarizing or "polishing" the surface of the substrate. Planarization is a process where material is removed from the surface of the substrate to form a generally even, planar surface. Planarization is also used to form an even surface for subsequent levels of metallization or processing as a substrate may become non-planar due to prior layers of materials which were previously deposited and removed. Planarization is also useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing pad in a CMP apparatus. The carrier assembly provides a controllable pressure to the substrate urging the substrate against the polishing pad. The pad is moved relative to the substrate by an external driving force. Thus, the CMP apparatus effects polishing or rubbing movement between the surface of the substrate and the polishing pad while dispersing a polishing composition to effect both chemical activity and mechanical activity. Typically, the polishing composition is in the form of a slurry containing a polishing agent, such as finely-dimensioned alumina ($Al_2O_3$), silica ($SiO_2$), titania ($TiO_2$), or ceria ($CeO_2$) particles. Typically, the polishing composition additionally contains a number of chemicals, depending upon the materials to be polished, including pH adjusting and stabilizing agents, as well as chemical oxidizing agents for chemically reacting with various components of the surface being polished/planarized.

Conventionally, in polishing copper features, such as dual damascenes, the copper material is polished to the barrier layer, and then the barrier layer is polished to the underlying dielectric layer to form the dual damascene feature. One challenge which is present in polishing of copper material and barrier layer material is that it is difficult to polish residual conductive material remaining at the interface between the conductive material layer and the barrier layer. Therefore, overpolishing of the conductive material at the interface is necessary to ensure all of the conductive material is removed prior to subsequent barrier layer removal. However, overpolishing of the conductive material at the interface can result in dishing or erosion of the conductive material layer in the features.

Figure 1:
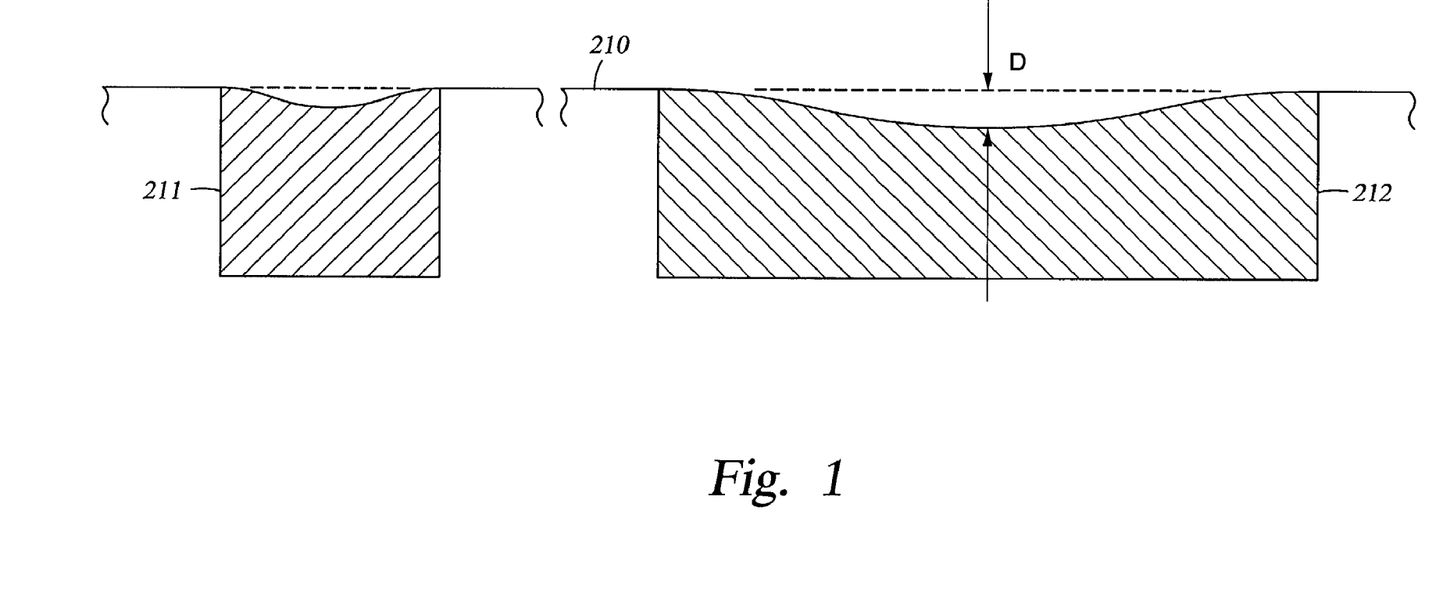
FIG. 1 is a schematic view of a substrate illustrating the phenomenon of dishing.

FIG. 1 is a schematic view of a substrate illustrating the phenomenon of dishing. Conductive lines 211 and 212 are formed by depositing conductive material, such as copper or copper alloy, in a feature definition formed in the dielectric layer 210, typically comprised of silicon oxides or other dielectric materials. After planarization, a portion of the conductive material is depressed by an amount D, referred to as the amount of dishing, forming a concave copper surface. Dishing results in a non-planar surface that impairs the ability to print high resolution lines during subsequent photolithographic steps and detrimentally affects subsequent surface topography of the substrate and device formation. Dishing also detrimentally affects the performance of devices by lowering the conductance and increasing the resistance of the devices, contrary to the benefit of using higher conductive materials, such as copper.

Another difficulty encountered is that current slurries used for barrier layer removal typically include a large concentration of abrasives and harsh chemical such as oxidizing agents. Furthermore, a high down force is applied to the substrate against the polishing pad to effect polishing of the barrier layer. As a consequence, the removal rate of the barrier layer is hard to control. Therefore polishing and/or overpolishing of the barrier layer may also result in dishing and erosion of the conductive material layer in the features and may result in dishing erosion of the dielectric layer. Still, the removal rate of the barrier layer for these slurries is very low resulting in a low throughput.

Therefore, there exists a need for a method and related CMP composition which facilitates the removal of a conductive material layer and a barrier layer, and provides selectivity therebetween and to an underlying dielectric layer.

SUMMARY OF THE INVENTION

The present invention relates generally to a composition and a method for selective removal of a barrier layer in chemical mechanical polishing. In one aspect, the composition for selective removal of a barrier layer includes at least one reducing agent, ions from at least one transitional metal, and water. The composition may further include at least one buffer for pH stability, at least one pH adjusting agent for providing an initial pH, a corrosion inhibitor, abrasive particles, and/or a metal chelating agent.

In another embodiment, the invention relates generally to a composition and a method for removal of a conductive material layer and a barrier layer in chemical mechanical polishing. In one aspect, the method for removal of a conductive material layer and a barrier layer includes applying a conductive-material-layer-selective composition to a polishing pad, polishing the substrate in the presence of the conductive-material-layer-selective composition, applying a barrier-layer-selective composition to a polishing pad, and polishing the substrate in the presence of the barrier-layer-selective composition.

In another embodiment, the invention relates to a method for processing a substrate, comprising providing a substrate comprising a dielectric layer with feature definitions formed therein, a barrier layer conformally deposited on the dielectric layer and in the feature definitions formed therein, and a conductive material layer deposited on the barrier layer and filling the feature definitions formed therein; polishing the substrate with a composition comprising a chelating agent, an oxidizer, a corrosion inhibitor, and water to remove the conductive material layer; and polishing the substrate with a composition comprising a reducing agent, ions from at least one transitional metal, and water to remove the barrier layer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

CMP is broadly defined herein as polishing a substrate by chemical activity, mechanical activity, or a combination of both chemical and mechanical activity. In some systems, a substrate is polished on a pad in the presence of a polishing fluid, also known as a slurry, which contains chemicals that chemically react with the layer being polished and abrasives that mechanically abrade or remove material from the layer being polished. The interaction of a polishing pad, the chemically reactive polishing fluid, and the abrasive polishing fluid with the surface of the substrate imparts a combination of chemical and mechanical forces to the substrate surface which planarizes the substrate surface and results in controlled polishing of the exposed layer. In other systems, a polishing pad called a fixed abrasive pad comprising a backing sheet with a plurality of abrasive elements adhered thereto is used which does not require abrasive particles within the slurry.

One apparatus for performing the planarizing process and composition described herein is a Mirra® CMP System available from Applied Materials, Inc., as shown and described in U.S. Pat. No. 5,738,574, entitled, "Continuous Processing System for Chemical Mechanical Polishing," the entirety of which is incorporated herein by reference. Although, the CMP process and composition is illustrated utilizing the Mirra® CMP System, any system enabling chemical mechanical polishing using the composition described herein can be used to advantage. Examples of other suitable polishing apparatuses include the Obsidian 8200C System available from Applied Materials, Inc. and a linear polishing system using a sliding or circulating polishing belt or similar device. An example of a linear polishing system is more fully described in co-pending U.S. patent application Ser. No. 09/244,456, filed on Feb. 4, 1999, and incorporated herein by reference to the extent not inconsistent with the invention. The following apparatus description is illustrative and should not be construed or interpreted as limiting the scope of the invention.

Figure 2:
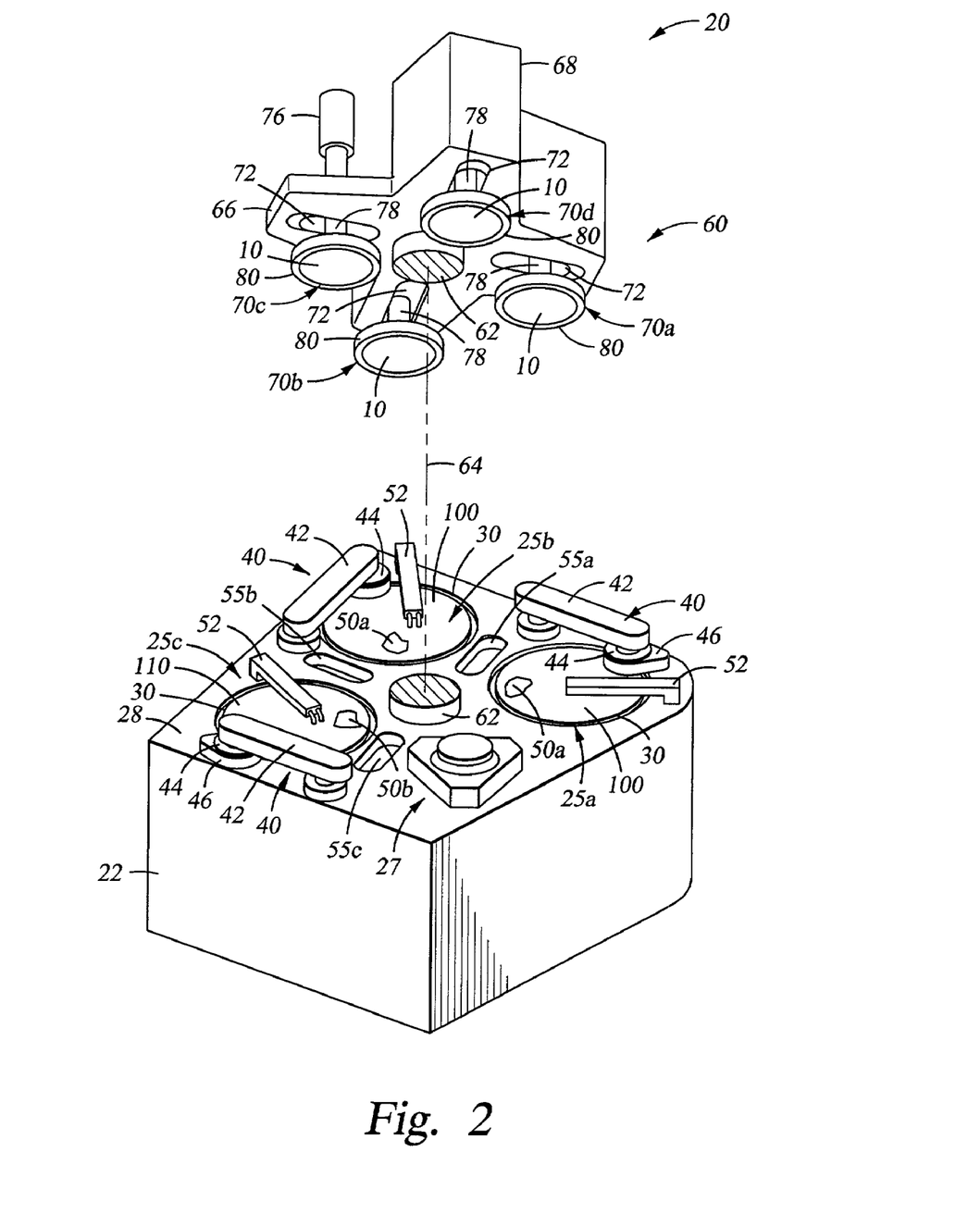
FIG. 2 is a schematic perspective view of a chemical mechanical polishing apparatus.

FIG. 2 is a schematic perspective view of a chemical mechanical polishing apparatus 20 illustrating one chemical polishing apparatus. The polishing apparatus 20 includes a lower machine base 22 with a table top 28 mounted thereon and a removable outer cover (not shown). The table top 28 supports a series of polishing stations, including a first polishing station 25a, a second polishing station 25b, a final polishing station 25c, and a transfer station 27. The transfer station 27 serves multiple functions, including, for example, receiving individual substrates 10 from a loading apparatus (not shown), loading the substrates into carrier heads 80, receiving the substrates 10 from the carrier heads 80, washing the substrates 10 again, and transferring the substrates 10 back to the loading apparatus.

Each polishing station 25a–25c includes a rotatable platen 30 having a polishing pad 100 disposed thereon. Each platen 30 may be a rotatable aluminum or stainless steel plate connected to a platen drive motor (not shown). The polishing stations 25a–25c may include a pad conditioner apparatus 40. The pad conditioner apparatus 40 has a rotatable arm 42 holding an independently rotating conditioner head 44 and an associated washing basin 46. The pad conditioner apparatus 40 maintains the condition of the polishing pad so that it will effectively polish the substrates. Each polishing station may include a conditioning station if the CMP apparatus is used with other pad configurations.

The polishing stations 25a–25c may each have a slurry/rinse arm 52 that includes two or more supply tubes to provide one or more chemical slurries and/or water to the surface of the polishing pad. The slurry/rinse arm 52 delivers the one or more chemical slurries in amounts sufficient to cover and wet the entire polishing pad. Each slurry/rinse arm 52 also includes several spray nozzles (not shown) that may provide a high-pressure fluid rinse on to the polishing pad at the end of each polishing and conditioning cycle. Furthermore, two or more intermediate washing stations 55a, 55b, and 55c may be positioned between adjacent polishing stations 25a, 25b, and 25c to clean the substrate as it passes from one station to the next. Applying a composition to a polishing pad as used herein is understood to mean applying the composition to the polishing pad, the substrate, and/or to any other working piece in the CMP apparatus.

A rotatable multi-head carousel 60 is positioned above the lower machine base 22. The carousel 60 includes four carrier head systems 70a, 70b, 70c, and 70d. Three of the carrier head systems receive or hold the substrates 10 by pressing them against the polishing pads 100 disposed on the polishing stations 25a–25c. One of the carrier head systems 70a–70d receives a substrate from and delivers a substrate 10 to the transfer station 27. The carousel 60 is supported by a center post 62 and is rotated about a carousel axis 64 by a motor assembly (not shown) located within the machine base 22. The center post 62 also supports a carousel support plate 66 and a cover 68.

The four carrier head systems 70a–70d are mounted on the carousel support plate 66 at equal angular intervals about the carousel axis 64. The center post 62 allows the carousel motor to rotate the carousel support plate 66 and orbit the carrier head systems 70a–70d about the carousel axis 64. Each carrier head system 70a–70d includes one carrier head 80. A carrier drive shaft 78 connects a carrier head rotation motor 76 (shown by the removal of one quarter of the cover 68) to the carrier head 80 so that the carrier head 80 may independently rotate about its own axis. There is one carrier drive shaft 74 and motor 76 for each head 80. In addition, each carrier head 80 independently oscillates laterally in a radial slot 72 formed in the carousel support plate 66.

The carrier head 80 performs several mechanical functions. Generally, the carrier head 80 holds the substrate 10 against the polishing pad 100, evenly distributes a downward pressure across the back surface of the substrate 10, transfers torque from the drive shaft 78 to rotate the substrate 10, and ensures that the substrate 10 does not slip out from beneath the carrier head 80 during polishing operations. In one embodiment, the carried head 80 exerts a pressure between about 1 psi and about 8 psi against the substrate on the polishing pad 100 during CMP, and the substrate 10 is then polished for a requisite amount of time sufficient for removal of the desired layer or depth.

Figure 3:
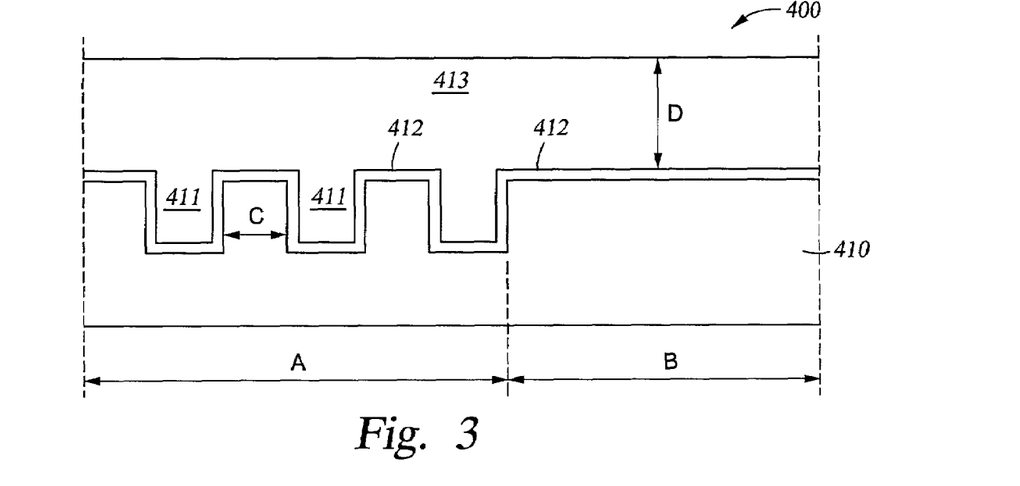
FIGS. 3–5 are schematic diagrams of a substrate illustrating one embodiment of a process and a method for planarizing a substrate surface described herein.

FIG. 3 is a schematic cross-sectional view of an example of one type of feature formed on a substrate which requires planarization. The substrate includes a dielectric layer 410 formed on a substrate 400. A plurality of apertures 411, such as vias, trenches, or holes, are patterned and etched into the dielectric layer 410 in area A forming features for a dense array of conductive lines with area B being unetched. The openings 411 are spaced apart by a distance C which may be any distance. The openings 411 may be formed in the dielectric layer 410 by conventional photolithographic and etching techniques. A barrier layer 412 is disposed conformally in the openings 411 and on the upper surface of the dielectric layer 410. A conductive material layer 413 is disposed on the barrier layer at a thickness (D). The term "conductive material layer" as used herein is defined as any conductive material layer used to fill a feature to form lines, contacts, or vias.

The dielectric layer 410 may comprise any of various dielectric materials conventionally employed in the manufacture of semiconductor devices. For example, dielectric materials may include materials such as silicon dioxide, phosphorus-doped silicon glass (PSG), boron-phosphorus-doped silicon glass (BPSG), and silicon dioxide derived from tetraethyl orthosilicate (TEOS) or silane by plasma enhanced chemical vapor deposition (PECVD). The dielectric layer may also comprise low dielectric constant materials, including fluoro-silicon glass (FSG), polymers, such as polyamides, and carbon-containing silicon dioxide.

One type of barrier layer 412 comprises tantalum, tantalum nitride, or combinations thereof. As used throughout this disclosure, the word "tantalum" and the symbol "Ta" are intended to encompass tantalum, tantalum nitride, and combinations thereof. Other types of barrier layers 412 comprise titanium, titanium nitride, refractory metals, refractory metal nitrides, and combinations thereof.

One type of conductive material layer 413 comprises copper containing materials. Copper containing materials include copper, copper alloys (e.g., copper-based alloys containing at least about 80 weight percent copper), or doped copper. As used throughout this disclosure, the phrase "copper containing material," the word "copper," and the symbol "Cu" are intended to encompass copper, copper alloys, doped copper, and combinations thereof.

Figure 4:
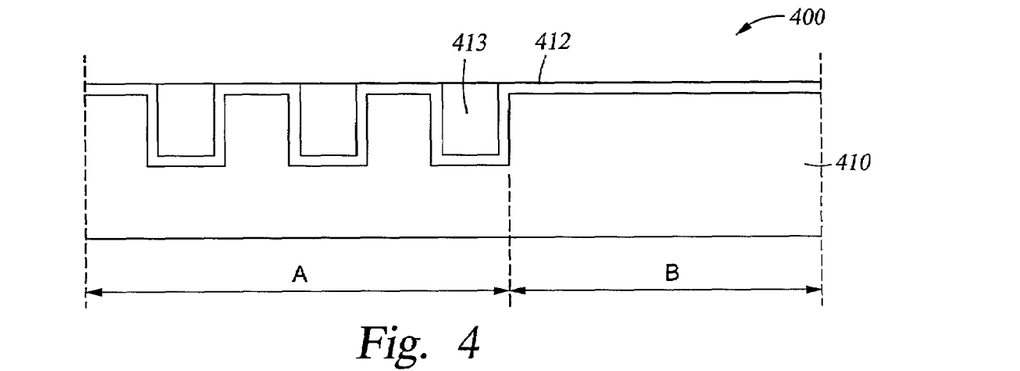

In one embodiment, the method of planarizing the substrate 400 comprises a two step CMP process for removing the conductive material layer 413 and the barrier layer 412 above the dielectric layer 410. In the first step, one or more slurry compositions (herein referred to as the "conductive-material-layer-selective composition") are used during CMP to selectively remove the bulk conductive material layer 413, such as a copper conductive material layer, as shown in FIG. 4. If necessary, some overpolishing may be performed during bulk removal to ensure complete removal of the conductive material layer 413 whereby a portion of the underlying barrier layer 412 material may be removed, depending on the selectivity of the composition.

CMP may be conducted with either a high or a low selectivity with respect to the particular layer or material being removed by the polishing/planarization process. Selectivity is defined broadly herein as the rate of removal of one material in comparison to the rate of removal of a second or additional materials in a CMP process. Selective to a "material" is broadly defined herein as removing the material at a higher rate than other materials or adjacent materials in a CMP process. When CMP is performed with high selectivity, the removal rate of the selected material is significantly higher than that of other material(s) exposed at the surface of the substrate being polished. Conversely, when CMP is performed with low selectivity, each material present on or at the substrate surface being polished is removed at substantially the same rate.

In one embodiment, the conductive-material-layer-selective composition has a selectivity of between about 1:0 to about 1:0.5, preferably between about 1:0.0 to about 1:0.1, and most preferably about 1:0, between a copper conductive material layer 413 and a tantalum barrier layer 412. The selectivity of the conductive-material-layer-selective composition allows for effective removal of the copper layer 413 to the tantalum layer 412, minimizes dishing of the copper layer 413, and minimizes formation of a non-planar surface following bulk removal of the conductive material disposed thereon. However, other conductive-material-layer-selective compositions with different selectivities may be used in the first step.

Figure 5:
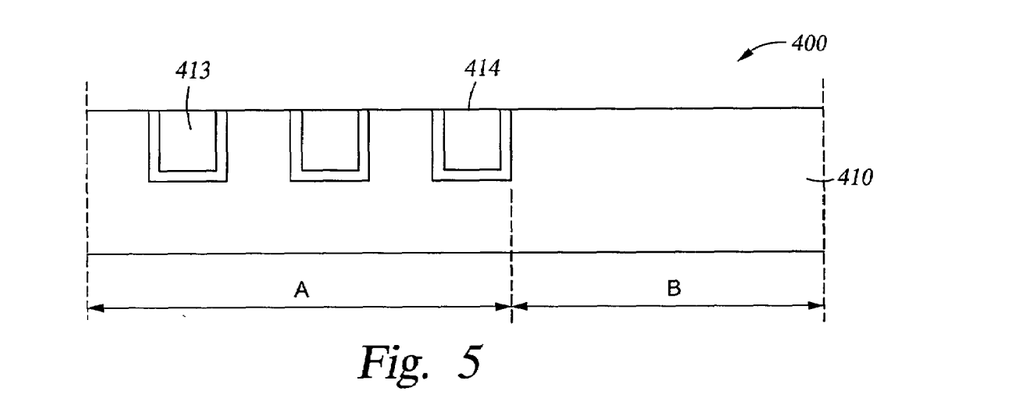

In a second step, one or more slurry compositions (herein referred to as the "barrier-layer-selective composition") are used during CMP to selectively remove the barrier layer material 412, such as a tantalum barrier layer, from the underlying dielectric layer 410, thereby planarizing the surface of the substrate as shown in FIG. 5. In one embodiment, the barrier-layer-selective composition has a high selectivity to the tantalum barrier layer 412 in comparison to the copper layer 413 and to the dielectric layer 410 of between about 1:0:0 to 1:0.5:0.5, preferably between about 1:0:0 to about 1:0.2:0.2, which allows for removal of substantially all of the tantalum material while minimizing removal of the dielectric layer 410 and minimizing dishing of the copper layer 413. In another embodiment, the barrier-layer-selective composition removes the tantalum barrier layer at a rate of at least about 250 Å/min, preferably at a rate of at least about 750 Å/min, and most preferably at a rate between about 1,000 Å/min to about 2,000 Å/min while removing the copper layer and the dielectric layer both at a rate less than about 100 Å/min, preferably at a rate less than about 50 Å/min. However, the dielectric layer 410 may be further polished during the second step to remove or reduce scratching or defects formed on the substrate surface. The resulting copper features comprise a dense array A of copper lines 413 bordered by open field areas B and the planar surface 414 of the copper metallization and substrate 400.

The selectivity of the compositions was determined by comparing the removal rate during CMP of a patterned substrate having copper material, tantalum material, and dielectric material deposited thereon. The CMP of the substrate was performed on a Mirra® CMP System available from Applied Materials, Inc. An appropriated polishing pad, such as an IC pad available from Rodel, Inc. of Newark, Del., was used as the polishing pad. The down force of the carrier head was about 4.5 psi.

Conductive-Material-Layer-Selective Composition for Selectively Removing a Copper Material Layer One embodiment of the conductive-material-layer-selective composition for selectively removing a conductive material layer in the first step comprises a composition selective for removing a copper material layer. The composition comprises one or more chelating agents, one or more oxidizers, one or more corrosion inhibitors, and water (preferably deionized water). The CMP composition may also further include one or more pH adjusting agents, and/or abrasive particles.

For example, the chelating agents may comprise chemical compounds with one or more amine or amide groups, such as ethylenediaminetetraacetic acid, ethylenediamine, methylformamide, or other organic acids, such as iminodiacetic acid or oxalic acid. The chelating agents may be present at a concentration between about 0.1 weight percent to about 5 weight percent, preferably between about 0.2 weight percent to about 3 weight percent of the CMP composition.

The oxidizers may comprise any of various conventional oxidizers employed in CMP compositions and processes, such as hydrogen peroxide, ferric nitride, iodates, or other compounds, present in an amount between about 0.1 weight percent to about 10 weight percent, preferably from about 0.5 weight percent to about 8 weight percent of the CMP composition.

The corrosion inhibitors may comprise any of various chemical compounds, for example organic compounds containing an azole group, such as benzotriazole, mercaptobenzotriazole, or 5-methyl-1-benzotriazole. The corrosion inhibitors may be present in a concentration between about 0.02 weight percent to about 1 weight percent, preferably from about 0.05 weight percent to about 0.5 weight percent of the CMP composition.

The composition may further include one or more pH adjusting agents to adjust the pH if the pH is outside of the targeted pH or pH range. The pH adjusting agent or agents may comprise any of various inorganic and organic bases and acids, such as potassium hydroxide (KOH), acetic acid, phosphoric acid, nitric acid, or oxalic acid, present in an amount sufficient to adjust the pH of the CMP composition to between about 2.5 to about 11, preferably between about 3 to about 10, more preferably between about 4 to about 8.

In one embodiment, the CMP composition may further comprise up to about 35 weight percent of abrasive particles, such as alumina ($Al_2O_3$), silica ($SiO_2$), titania ($TiO_2$), or ceria ($CeO_2$) particles. In another embodiment, the CMP composition is a fixed-abrasive composition utilizing a fixed-abrasive pad.

Not wishing to be limited to any one theory, the CMP composition used in the first step is believed to oxidize the surface of the conductive material, such as Cu, to produce oxidized copper material, such as Cu ions or copper oxide (CuO), during the CMP process. The oxidized copper material is then mechanically abraded by the polishing pad from the substrate surface and may be entrained in the CMP composition. The chelating agent in the CMP composition chemically reacts with any metal ions produced during the CMP process to form soluble metal complexes to minimize re-deposition of metal ions on the surface of the substrate and to increase removal of the metal ions from the substrate surface.

The foregoing is directed to one or more embodiments for bulk removal of the conductive material layer. However, other steps, compositions, and concentrations may be used for bulk removal. Other suitable compositions for conductive material layer removal are disclosed in co-pending U.S. patent application Ser. No. 09/543,777, filed on Apr. 5, 2000, U.S. patent application Ser. No. 09/544,281, filed on Apr. 6, 2000, and U.S. patent application Ser. No. 09/608,078, filed on Jun. 30, 2000, all of which are incorporated herein by reference to the extent not inconsistent with the invention.

Barrier-Layer-Selective Composition for Selectively Removing a Tantalum Barrier Layer One embodiment of the barrier-layer-selective composition for selectively removing a barrier layer in the second step comprises a composition selective for removing a tantalum barrier layer. The composition comprises at least one reducing agent, ions from at least one transitional metal, and water (preferably deionized water). In one embodiment, the ions from at least one transitional metal are in a high valence state. In another embodiment, the composition has an initial pH in the range in which the reducing agent is active. In another embodiment, the composition has an initial pH in the range of between about 2 and about 12. The composition may further include at least one pH adjusting agent for providing the initial pH. In another embodiment, the CMP composition may also include at least one buffer for pH stability, at least one corrosion inhibitor, abrasive particles, and/or at least one metal chelating agent.

For example, the reducing agent, which includes, but is not limited, to hydroxylamine, glucose, sulfothionate, potassium iodide, sodium thiosulfate, oxalic acid, or combinations thereof, is present in the composition at a concentration of at least about 0.005 weight percent, preferably at a concentration between about 0.01 weight percent and about 0.5 weight percent. Generally, there is no upper limit to the concentration of the reducing agent because excess reducing agent does not impair the selectivity or the removal rate of the composition. However, because reducing agents add costs to the processing of substrates, ideally as little as possible of the reducing agents is used in the composition while still providing commercially practicable selectivity and removal rates. For example, the reducing agent is preferably present in the composition at a concentration of less than about 10%, and more preferably less than 1%.

The initial pH of the composition depends on the reducing agent being used. Some reducing agents are active in an acidic medium, in a basic medium, or in both an acidic and basic medium. For example, hydroxylamine is active as a reducing agent at a pH of between about 3 to about 11. Glucose is active as a reducing agent at any pH, but preferably between a pH of between about 8 to about 12. Sulfothionate is believed to be active as a reducing agent at a pH of between about 3 to about 11. Potassium iodide is believed to be active as a reducing agent at a pH of between about 3 to about 11. Sodium thiosulfate is believed to be active as a reducing agent at a pH of between about 3 to about 11. Oxalic acid is active as a reducing agent at a pH of between about 4.5 to about 5.5.

The composition may further include at least one pH adjusting agent to provide an initial pH in which the reducing agent is active if the pH is outside of the initial pH. The pH adjusting agent may be any organic or inorganic bases and acids, such as potassium hydroxide (KOH), acetic acid, phosphoric acid, nitric acid, or oxalic acid, present at a concentration sufficient to provide the composition with a selected pH.

The composition may further include a buffer agent to provide for a relatively stable pH environment in the range in which the reducing agent is active. The buffer agent includes but is not limited to an alkali metal bicarbonate or tetraborate-tetrahydrate salt, but preferably is potassium bicarbonate or potassium tetraborate-tetrahydrate. The buffer agent may be present at a concentration between about 0.1 weight percent to about 8 weight percent.

In addition, the composition may further include a corrosion inhibitor to prevent corrosion of the conductive material in the features. In one embodiment, the corrosion inhibitors may be various organic compounds containing an azole group, such as mercaptobenzotriazole or 5-methyl-1-benzotriazole, but preferably is benzotriazole, present in a concentration of up to about 2 weight percent of the CMP composition.

In one embodiment, the composition may further include abrasive particles, such as silica ($SiO_2$), alumina ($Al_2O_3$), titania ($TiO_2$), ceria ($CiO_2$) particles or combinations thereof, present in a concentration of between 0.0 to about 10 weight percent, preferably less than 1 weight percent, more preferably less than 0.3 weight percent, and most preferably abrasive free on an abrasive-free pad.

Furthermore, the composition may further include a chelating agent, such as a compound having carboxylate and/or amino groups, present in the composition between about 0.01 weight percent to about 0.5 weight percent.

Suitable transitional metal ions for use in performing selective CMP of barrier layer materials include, but are not limited to, copper (Cu) ions, iron (Fe) ions, or combinations thereof. In one embodiment, the ions from the at least one transitional metal are generated in situ during polishing. In one example, the Cu transitional metal ions may be generated in situ during polishing of a copper conductive layer in the first step and are still present on the surface of the substrate for use in polishing of the barrier layer materials in the second step. In another example, the Cu transitional metal ions are generated in situ during polishing of the barrier layer from the exposed copper in the features of the substrate. In another embodiment, the ions of the transition metal may be contained in the aqueous liquid composition when the composition is applied to the substrate surface or to the polishing pad, or may be introduced into the composition prior to or subsequent to the application of the composition to the substrate surface or to the polishing pad. In still another embodiment, the requisite transitional metal ions may also be supplied to the CMP composition of the second step by contacting a metal disk, such as a copper disk, with the polishing pad. It is believed that the transitional metal ions may aid in the selectivity or in the removal rate of the tantalum barrier layer.

The CMP composition may be selected to polish the barrier layer material at a sufficient selectivity to minimize polishing of the dielectric layer or stop polishing on contact with the dielectric layer. The tantalum barrier layer, the copper containing material layer and the dielectric layer are removed from the substrate at a ratio of tantalum barrier layer to copper containing material layer to dielectric layer between about 1:0:0 to 1:0.5:0.5, preferably between about 1:0:0 and about 1:0.2:0.2. The composition may be further adjusted for varying selectivities between the tantalum barrier layer, the copper conductive material layer, and dielectric layer. In one embodiment, the selectivity of the composition for copper is increased by making the composition more acidic. Copper tends to more easily dissolve in an acidic medium and thus is more easily removed during CMP. In another embodiment, the selectivity of the composition for the dielectric layer is increased by utilizing a polar organic solvent. Dielectric materials tend to dissolve in polar organic solvents and thus are more easily removed during CMP.

The operative mechanism by which the CMP composition facilitates rapid and selective planarization of tantalum containing barrier layer materials is not known with certainty. Not wishing to be limited to any one theory, it is believed that the problems attendant upon CMP of tantalum containing barrier layer materials stem from the chemically-inert nature of tantalum and its compounds. Prior art CMP compositions for the removal of a tantalum barrier layer rely on mechanical abrasion as the main polishing mechanism and strive to stabilize the copper and dielectric material to chemical reaction. It is believed that the present invention increases chemical reaction as the mechanism of removing tantalum material while also reducing chemical reaction of the copper and dielectric layer during CMP. Accordingly, the CMP composition of the second step has an increased selectivity to the tantalum barrier layer over the copper conductive material layer and the dielectric layer. It is believed that addition of the reducing agent is critical for the selectivity and the removal rate of the composition.

A higher removal rate of tantalum barrier layer material in comparison to the removal rate of the copper containing material and dielectric material has been observed to reduce dishing of the conductive material, to reduce erosion of the dielectric material, and to produce good uniformity of planarization on the substrate. In addition, the composition used in the second step selectively removes tantalum at a high removal rate, and, therefore, the throughput of this process is high. Finally, the ability to planarize using an abrasive-free process or a process utilizing a very low concentration of abrasives results in lower production and operation costs.

Moreover, the two-step conductive material layer and barrier layer removal process described herein can be performed on a single platen rather than having each step performed on two separate platens. This improves the processing efficiency by increasing the number of steps that can be performed on a polishing apparatus and improves equipment usage by minimizing the need for additional equipment. The process is also compatible with the requirements for manufacturing throughput on a large scale, and is fully compatible with all other aspects of conventional polishing technology utilized in the manufacture of high integration density semiconductor devices.

EXAMPLES

Various compositions were tested in a CMP process performed on a patterned substrate comprising a dielectric material of silicon dioxide with feature definitions formed thereon, 250 Å of tantalum material conformally deposited over the dielectric material and in the feature definitions formed therein, and copper material deposited on the tantalum material and filling the feature definitions formed therein in which the copper material has been removed from the field areas. For each example, the patterned substrates were polished in the presence of a polishing composition until the endpoint of the removal of 250 Å of tantalum material was detected by using a laser optical system. The height of the dielectric material and the copper material was then measured. The same patterned substrate was then polished again in the presence of the same type of polishing composition. The height of the dielectric material and the copper material was measured again to determine how much dielectric material and copper material have been removed CMP of the substrate was performed on a Mirra° CMP System available from Applied Materials, Inc. An IC pad from Rodel, Inc. was used as the polishing pad. The down force of the carrier head was about 4.5 psi.

Examples 1–3

In Example 1, hydroxylamine was used as the reducing agent in a concentration of about 0.4 wt. % in a pH of about 6.5 to about 10. A patterned substrate was polished for about 8 seconds and the endpoint of the removal of 250 Å of tantalum was detected. The patterned substrate was polished again for about 60 seconds. The removal of between about 0 Å and about 50 Å of copper was measured and the removal of between about 0 Å and about 50 Å of the dielectric was measured.

In Example 2, hydroxylamine was used as the reducing agent in a concentration of about 0.04 wt. % in a pH of about 6.5 to about 10. A patterned substrate was polished for about 8 seconds and the removal of 250 Å of tantalum was detected. The patterned substrate was again polished for about 60 seconds. The removal of between about 0 Å and about 50 Å of copper was measured and the removal of between about 0 Å and about 50 Å of the dielectric was measured.

In Example 3, hydroxylamine was used as the reducing agent in a concentration of about 0.005 wt. % in a pH of about 6.5 to about 10. A patterned substrate was polished for 8 seconds and the removal of 250 Å of tantalum was detected. The patterned substrate was polished again for about 60 seconds. The removal of between about 0 Å and about 50 Å of copper was measured the removal of between about 0 Å and about 50 Å of the dielectric was measured.

Examples 1–3 show one way that the tantalum barrier layer selective compositions reduces dishing of the copper material layer. For example, the tantalum barrier layer selective compositions may be used on a substrate having dishing of the copper material in the features in the amount of 400 Å after copper material layer removal. The substrate has a tantalum barrier layer with a thickness of 250 Å. The substrate is polished for 8 seconds in the presence of the tantalum barrier selective composition. In one embodiment of the composition, 250 Å of tantalum is removed while 0 Å of copper material and dielectric material is removed. Therefore, the dishing of the copper material layer after tantalum removal is now 150 Å (400 Å minus 250 Å).

Example 4

In Example 4, hydroxylamine was used as the reducing agent in a concentration of about 0.01 wt. % in various compositions with a pH between about 3 to about 11. A patterned substrate was polished for about 7.5 to about 12.5 seconds and the endpoint of the removal of 250 Å of tantalum was detected. The patterned substrate was polished again for about 60 seconds. The removal of between about 0 Å and about 50 Å of copper was measured and the removal of between about 0 Å and about 50 Å of the dielectric was measured.

Example 5

In Example 5, oxalic acid was used as the reducing agent in a concentration of about 0.2 wt. % in a pH of about 4.5 to about 5.5. A patterned substrate was polished for about 25 to about 50 seconds and the endpoint of the removal of 250 Å of tantalum was detected. The patterned substrate was polished again for about 60 seconds. The removal of between about 0 Å and about 50 Å of copper was measured and the removal of between about 0 Å and about 50 Å of the dielectric was measured.

While the foregoing is directed to the one or more embodiments of the invention, other and further embodiments of the invention may be devised without departing from the basic scope thereof, and the scope thereof is determined by the claims that follow including their equivalents.

What is claimed is:

1. A method for planarizing a substrate having a conductive material layer and a barrier layer deposited thereon, comprising:
   applying a conductive-material-layer-selective composition to a polishing pad, wherein the conductive-material-layer-selective composition comprises:
   at least one chelating agent;
   at least one oxidizer;
   at least one corrosion inhibitor; and
   water;
   polishing the substrate in presence of the conductive-material-layer-selective composition;
   applying a barrier-layer-selective composition to the polishing pad, the barrier-layer-selective composition comprising:
   at least one reducing agent;
   ions from at least one transitional metal; and
   water, and
   polishing the substrate in presence of the barrier-layer-selective composition.

2. The method of claim 1, wherein the conductive-material-layer-selective composition further comprises at least one pH adjusting agent.

3. The method of claim 1, wherein the conductive-material-layer-selective composition further comprises abrasive particles.

* * * * *